US012757727B2

(12) United States Patent
Baipadi et al.

(10) Patent No.: US 12,757,727 B2
(45) Date of Patent: Oct. 6, 2026

(54) INDUCTOR STRUCTURES INTEGRATED IN SEMICONDUCTOR DEVICES

(71) Applicant: GlobalFoundries U.S. Inc., Malta, NY (US)

(72) Inventors: Varuna Ananthapadmanabha Baipadi, Bangalore (IN); Muhammed Shafi Kunnathodi, Bangalore (IN); Venkata Narayana Rao Vanukuru, Bangalore (IN)

(73) Assignee: GLOBALFOUNDRIES U.S. Inc., Malta, NY (US)

(*) Notice: Subject to any disclaimer, the term of this patent is extended or adjusted under 35 U.S.C. 154(b) by 514 days.

(21) Appl. No.: 18/365,249

(22) Filed: Aug. 4, 2023

(65) Prior Publication Data

US 2025/0046704 A1 Feb. 6, 2025

(51) Int. Cl.
*H10W 20/40* (2026.01)

(52) U.S. Cl.
CPC ................................ *H10W 20/497* (2026.01)

(58) Field of Classification Search
CPC ............... H01L 23/5227; H01L 23/435; H01L 21/02365; H01L 21/2885
See application file for complete search history.

(56) References Cited

U.S. PATENT DOCUMENTS 7,370,403 B1 5/2008 Hsu et al.
9,570,233 B2 2/2017 Groves et al.
9,653,204 B2 5/2017 Vanukuru
2004/0227608 A1* 11/2004 Nakatani .................. H01P 5/10 336/173
2011/0241160 A1* 10/2011 Kerber .................. H10D 84/00 257/E29.325
2022/0293331 A1* 9/2022 Yen ..................... H01F 17/0006
2023/0317347 A1* 10/2023 Hoen .................. H01F 17/0006 331/167
2024/0021353 A1* 1/2024 Kim .................... H01F 17/0013
2024/0321497 A1* 9/2024 Yen .......................... H10D 1/20

FOREIGN PATENT DOCUMENTS

WO 2009128047 A1 10/2009
WO 2015112510 A1 7/2015

* cited by examiner

*Primary Examiner* — Jeff W Natalini
*Assistant Examiner* — Nicholas Leland Hutson
(74) *Attorney, Agent, or Firm* — Francois Pagette

(57) ABSTRACT

The disclosed subject matter relates generally to inductor structures integrated in semiconductor devices. More particularly, the present disclosure relates to a semiconductor device having a semiconductor chip, a redistribution layer on the semiconductor chip, and an inductor structure having an upper section in the redistribution layer and a lower section in the semiconductor chip. The upper section and the lower section are concentric about a center region of the inductor structure. The lower section is connected to the upper section.

20 Claims, 18 Drawing Sheets

View A-A

View B-B

View C-C

View D-D

View X-X

View X-X

View X-X

View X-X

View A-A

View B-B

View C-C

View A-A

View B-B

View C-C

INDUCTOR STRUCTURES INTEGRATED IN SEMICONDUCTOR DEVICES

FIELD OF THE INVENTION

The disclosed subject matter relates generally to inductor structures integrated in semiconductor devices. More particularly, the present disclosure relates to a semiconductor device having a semiconductor chip, a redistribution layer on the semiconductor chip, and an inductor structure having an upper section in the redistribution layer and a lower section in the semiconductor chip.

BACKGROUND

Inductors are important components in an electrical circuit along with resistors, capacitors, and transistors. An inductor may typically have a structure where a conductor is wound many times in a coil, screw, or spiral form. With an increased demand for communication electronic devices, semiconductor devices or integrated circuit (IC) devices may, for example, include voltage-controlled oscillators (VCO), low noise amplifiers (LNA), tuned radio receiver circuits, or power amplifiers (PA). Each of these tuned radio receiver circuits, VCO, LNA, and PA circuits may require on-chip inductor components in their circuit designs.

Several design considerations associated with forming on-chip inductor components in the semiconductor devices may, for example, include quality factor (i.e., Q-factor), self-resonance frequency, and cost considerations impacted by the area occupied by the formed on-chip inductor. Additionally, proximity and skin effects can complicate the design of efficient inductors operating at high frequencies. Skin effect is the tendency for high-frequency currents to flow on the surface of a conductor. Proximity effect is the tendency for current to flow in other undesirable patterns, e.g., loops or concentrated distributions, due to the presence of magnetic fields generated by nearby conductors. The Q-factor of an inductor can be reduced due to the proximity and skin effect losses. To minimize the reductions in the Q-factor, the inductors may be constructed with special considerations. For example, the winding may be limited to a single layer, and often the turns are spaced apart to separate the conductors. Accordingly, a semiconductor device having an inductor structure with good characteristics whilst overcoming the aforementioned challenges is needed.

SUMMARY

In an aspect of the present disclosure, there is provided a semiconductor device having a semiconductor chip, a redistribution layer on the semiconductor chip, and an inductor structure having a center region, an upper section in the redistribution layer, and a lower section in the semiconductor chip. The upper section and the lower section are concentric about the center region. The lower section is connected to the upper section. The upper section includes an outer portion having a concentric turn about the center region and an inner portion having a concentric turn about the center region. The lower section includes a concentric turn about the center region. The concentric turn in the inner portion of the upper section of the inductor structure has a smaller perimeter than the concentric turn in the lower section of the inductor structure.

In another aspect of the present disclosure, there is provided a semiconductor device having a semiconductor chip, a redistribution layer on the semiconductor chip, and an inductor structure having a center region, an upper section in the redistribution layer, and a lower section in the semiconductor chip. The upper section includes an outer portion having at least one concentric turn about the center region and an inner portion having at least one concentric turn about the center region. The at least one concentric turn in the inner portion has an outermost concentric turn. The lower section includes a plurality of spiral levels, each spiral level includes at least one concentric turn about the center region, the plurality of spiral levels has an uppermost spiral level being connected to the upper section of the inductor structure. The uppermost spiral level also has an innermost concentric turn. The outermost concentric turn in the inner portion of the upper section of the inductor structure has a smaller perimeter than the innermost concentric turn in the uppermost spiral level of the lower section of the inductor structure.

In yet another aspect of the present disclosure, there is provided a semiconductor device having a semiconductor chip, a redistribution layer on the semiconductor chip, and an inductor structure having a center region, an upper section in the redistribution layer, and a lower section in the semiconductor chip. The upper section includes an outer portion having at least one concentric turn about the center region and an inner portion having at least one concentric turn about the center region. The at least one concentric turn in the inner portion has an outermost concentric turn. The lower section of the inductor structure is between the outer portion of the upper section of the inductor structure and the inner portion of the upper section of the inductor structure.

BRIEF DESCRIPTION OF THE DRAWINGS

The present disclosure may be understood by reference to the following description taken in conjunction with the accompanying drawings.

For simplicity and clarity of illustration, the drawings illustrate the general manner of construction, and certain descriptions and details of features and techniques may be omitted to avoid unnecessarily obscuring the discussion of the described embodiments of the present disclosure. Additionally, elements in the drawings are not necessarily drawn to scale. For example, the dimensions of some of the elements in the drawings may be exaggerated relative to other elements to help improve understanding of embodiments of the present disclosure. The same reference numerals in different drawings denote the same elements, while similar reference numerals may, but do not necessarily, denote similar elements.

DETAILED DESCRIPTION

Various illustrative embodiments of the present disclosure are described below. The embodiments disclosed herein are exemplary and not intended to be exhaustive or limiting to the present disclosure.

As used herein, "deposition techniques" refer to the process of applying a material over another material (or the substrate). Exemplary techniques for deposition include, but are not limited to, spin-on coating, sputtering, chemical vapor deposition (CVD), physical vapor deposition (PVD), molecular beam deposition (MBD), pulsed laser deposition (PLD), liquid source misted chemical deposition (LSMCD), atomic layer deposition (ALD).

Additionally, "patterning techniques" include deposition of material or photoresist, patterning, exposure, development, etching, cleaning, and/or removal of the material or photoresist as required in forming a described pattern, structure, or opening. Examples of techniques for patterning include, but are not limited to, wet etch lithographic processes, dry etch lithographic processes, or direct patterning processes. Such techniques may use mask sets and mask layers.

Figure 1:
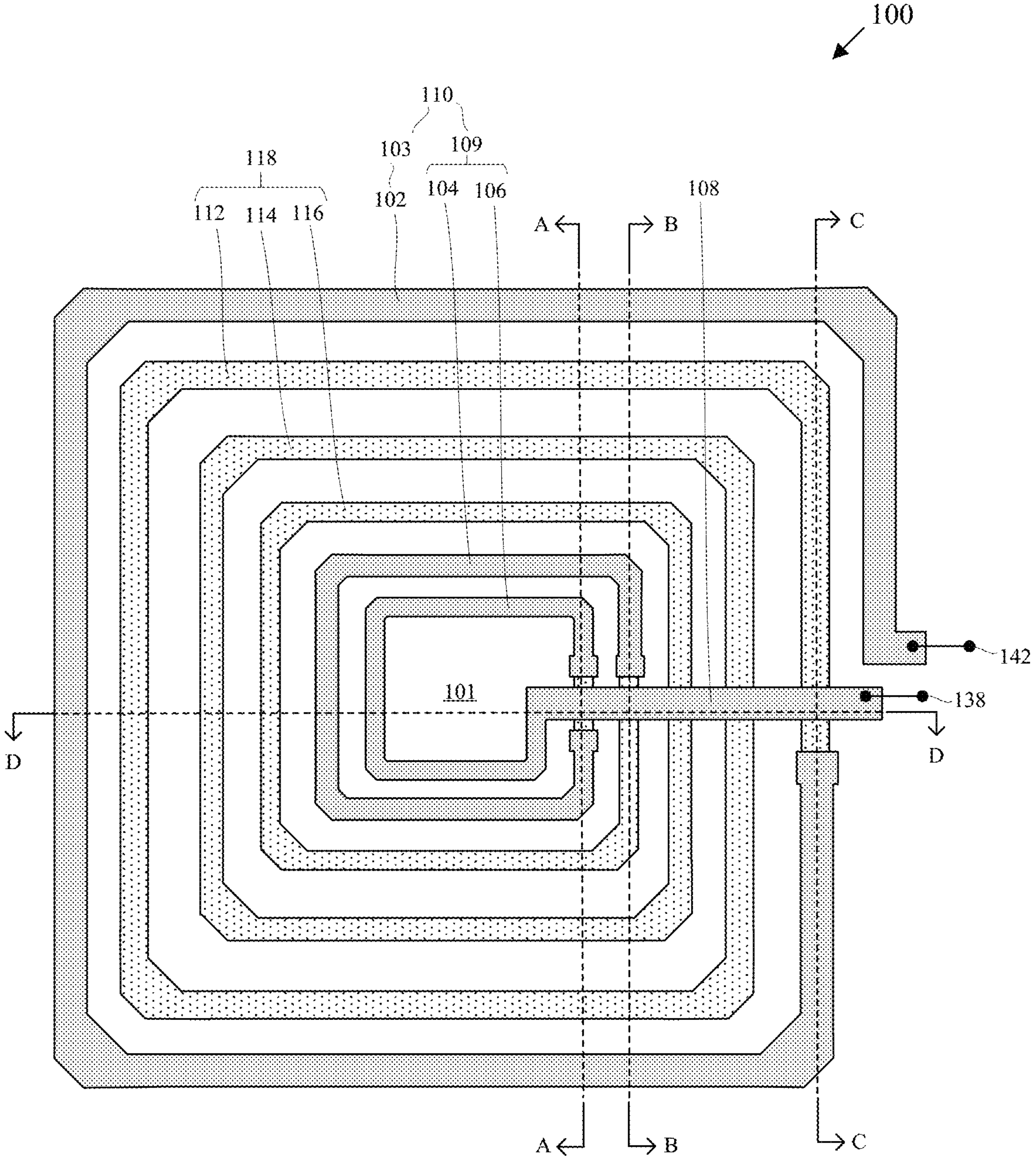
FIG. 1 is a top-down view of an example inductor structure integrated in a semiconductor device.
Figure 2A:
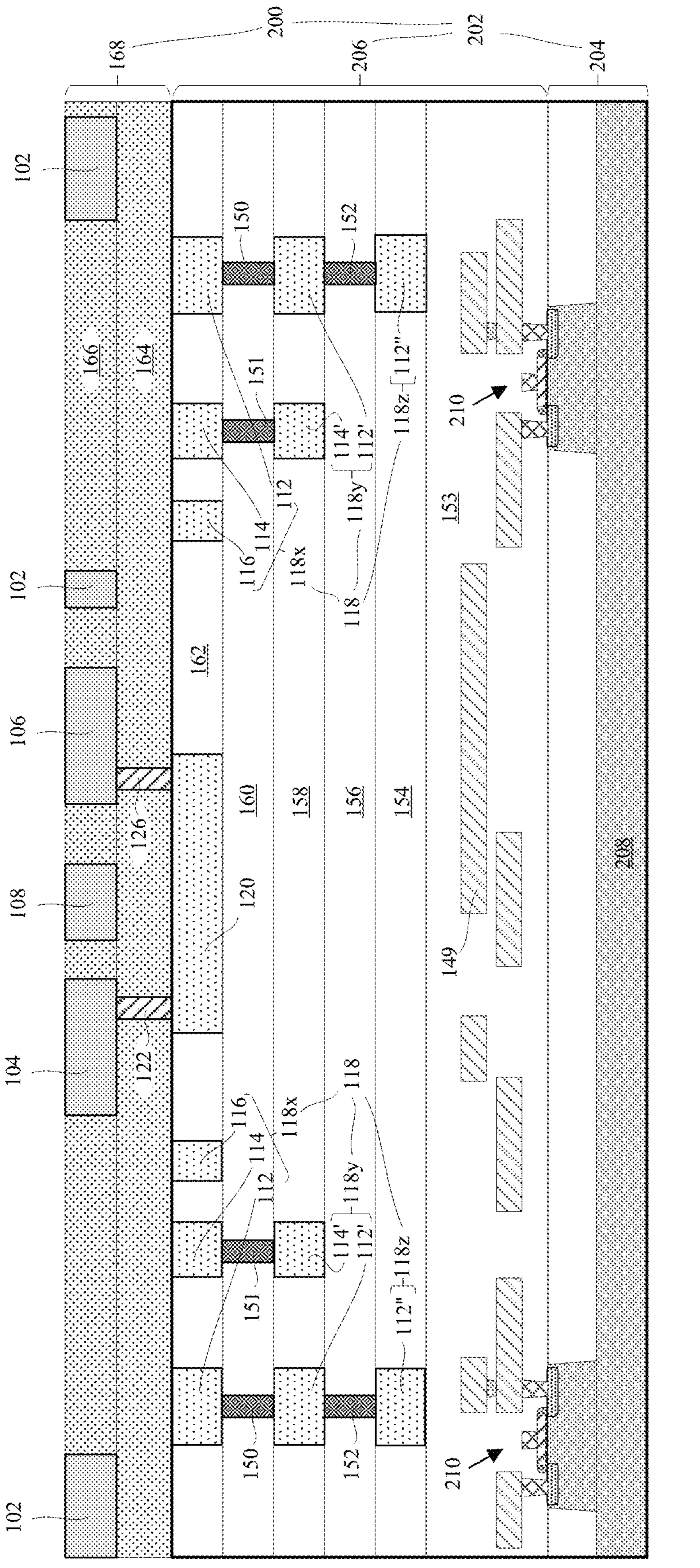
FIG. 2A to FIG. 2D are cross-sectional views of the semiconductor device having the example inductor structure shown in FIG. 1.
Figure 2B:
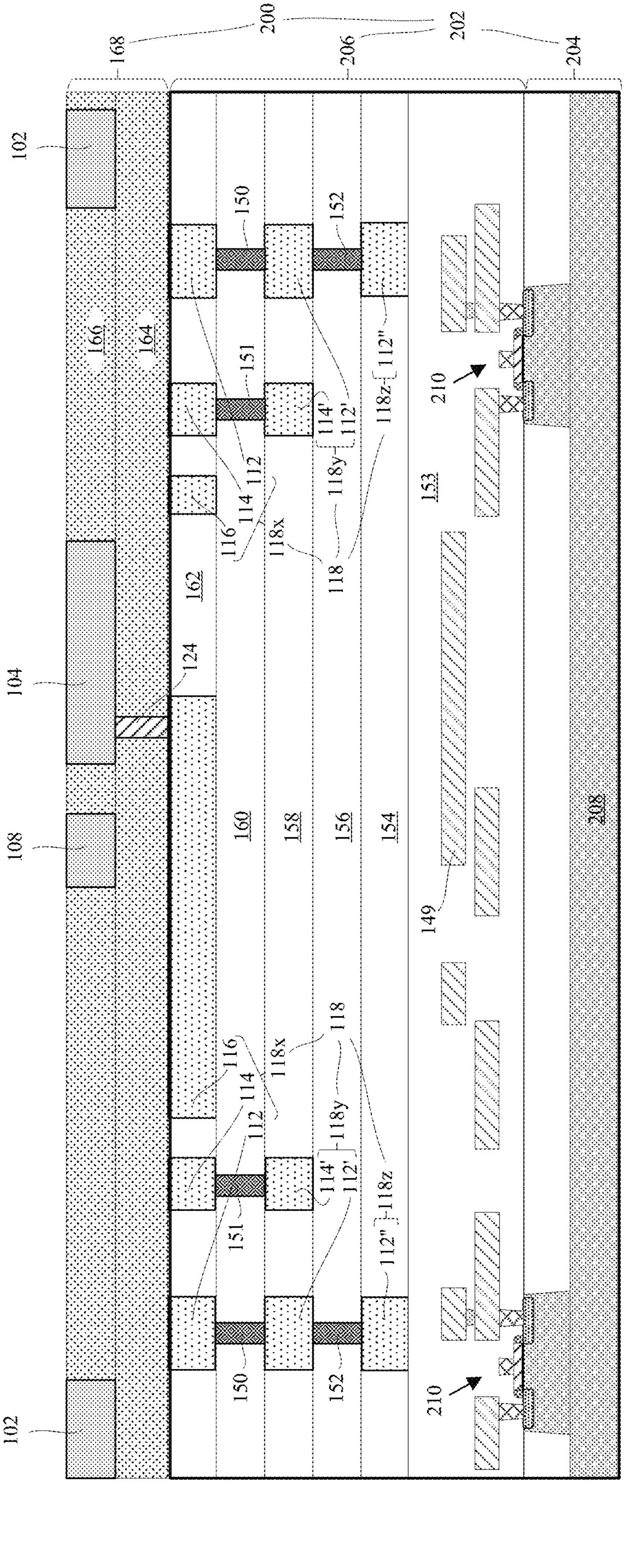
Figure 2C:
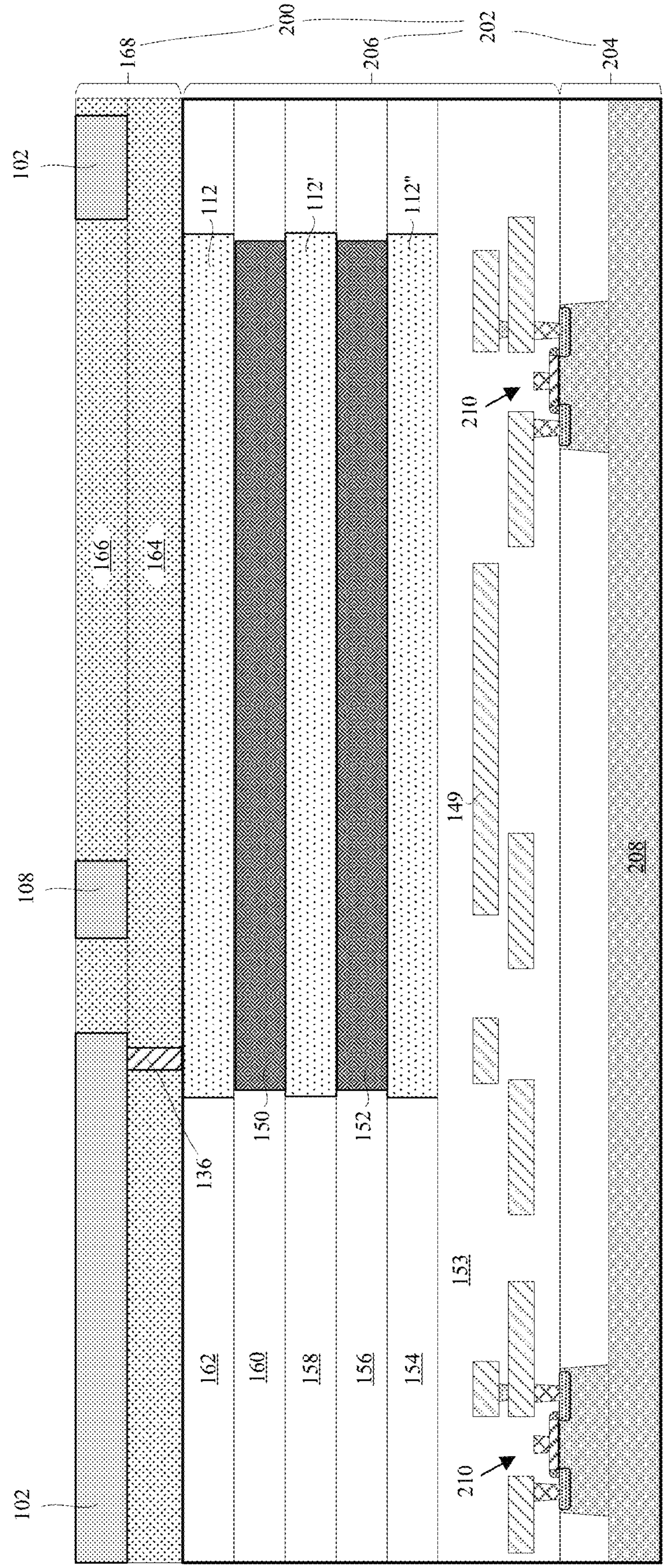
Figure 2D:
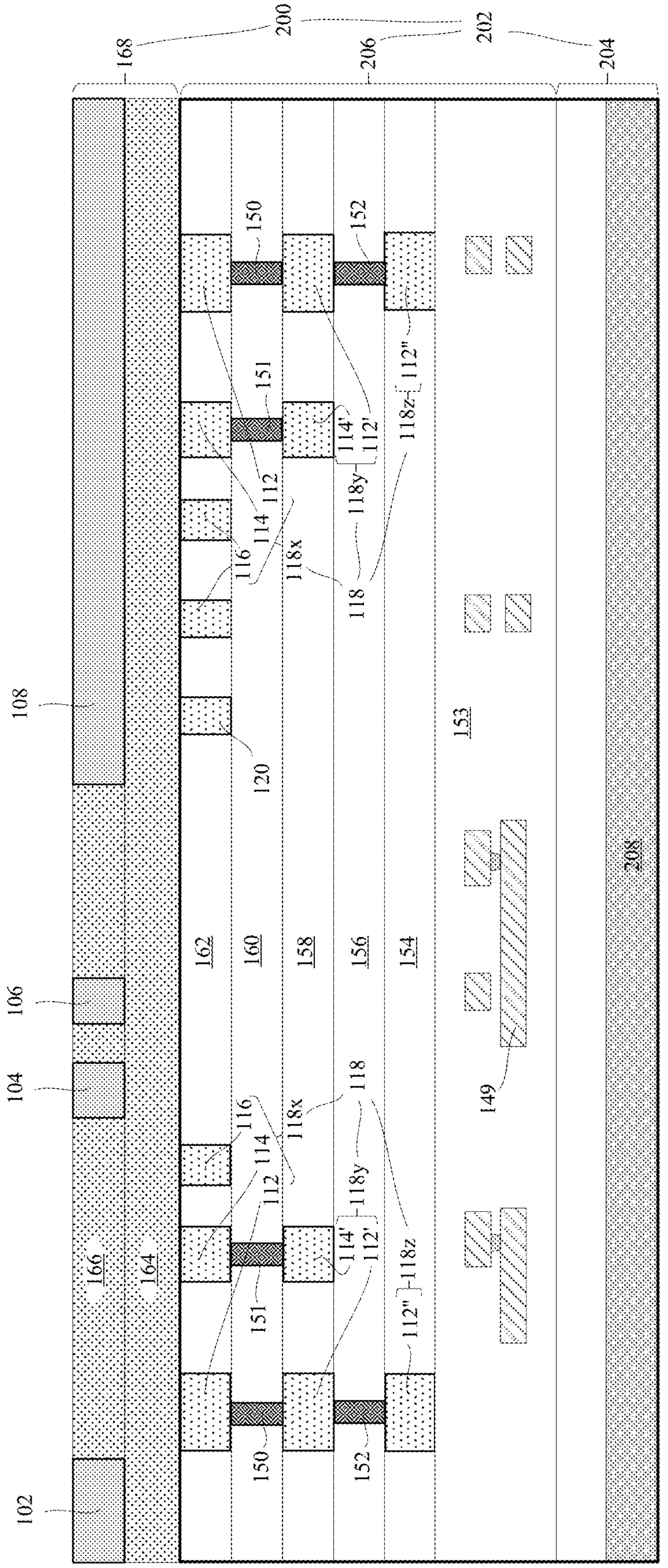

FIG. 1 illustrates a top-down view of an example inductor structure integrated in a semiconductor device while FIG. 2A through FIG. 2D are cross-sectional views of the semiconductor device having the example inductor structure shown in FIG. 1. FIG. 2A is the cross-sectional view taken along line A-A in FIG. 1. FIG. 2B is the cross-sectional view taken along line B-B in FIG. 1. FIG. 2C is the cross-sectional view taken along line C-C in FIG. 1. FIG. 2D is the cross-sectional view taken along line D-D in FIG. 1.

Referring to FIG. 1 and FIG. 2A to FIG. 2D, a semiconductor device 200 may include a semiconductor chip 202, a redistribution layer 168 on the semiconductor chip 202, and an inductor structure 100. The inductor structure 100 may have a center region 101 and may include an upper section 110 and a lower section 118. The inductor structure 100 may be of a spiral or coil form such that the upper section 110 and the lower section 118 are concentric to each other and are also concentric about the center region 101. The upper section 110 of the inductor structure 100 may be in the redistribution layer 168. The lower section 118 of the inductor structure 100 may be in the semiconductor chip 202. The lower section 118 may be connected to the upper section 110.

The inductor structure 100 may be constructed using various interconnect features to form spiral layers arranged in a vertical stack, in which each spiral layer can include one or more concentric turns. The term "interconnect features" may refer to wiring structures or conductors used in semiconductor devices for enabling transmission of electrical signals between circuitry components within the semiconductor devices. Examples of interconnect features may include, but are not limited to, interconnect vias, interconnect layers, conductive layers, conductive pads, and bond pads. These interconnect features may be formed in a number of ways using a number of different tools. For example, the fabrication of the interconnect features may use at least three building blocks: (i) deposition of material layers over a substrate or a semiconductor chip, (ii) patterning the deposited material layers to form openings or trenches in the deposited layers, and (iii) depositing conductive materials into the openings or trenches. These interconnect features may also be formed in the redistribution layer 168 and the semiconductor chip 202. The interconnect features described herein may include conductive materials, such as tantalum (Ta), tungsten (W), ruthenium (Ru), cobalt (Co), copper (Cu), titanium (Ti), nickel (Ni), platinum (Pt), aluminum (Al), or an alloy thereof.

The semiconductor chip 202 may include a front end of the line (FEOL) section 204 and a back end of the line (BEOL) section 206. The FEOL section 204 may include various device regions, such as transistors 210, formed over a substrate 208. The BEOL section 206 may include the interconnect features 112, 114, 116, 112', 114', 112", 150, 151, 152 for constructing the lower section 118 of the inductor structure 100, as well as interconnect features 149 for enabling transmission of electrical signals between other device regions in the semiconductor chip 202 or other circuitry components in the semiconductor device. The BEOL section 206 may also include several interlayer dielectric levels 153, 154, 156, 158, 160, 162. The interconnect features 112, 114, 116, 112', 114', 112", 150, 151, 152, 149 may be formed in the interlayer dielectric levels 153, 154, 156, 158, 160, 162. The interlayer dielectric levels 153, 154, 156, 158, 160, 162 may include, but is not limited to, silicon dioxide, tetraethyl orthosilicate (TEOS), or a material having a chemical composition of $SiC_xO_yH_z$, wherein x, y, and z are in stoichiometric ratio.

The redistribution layer 168 may be formed on or directly on the semiconductor chip 202 using the deposition techniques described herein. The redistribution layer 168 may include one or more connection levels 164, 166. The one or more connection levels 164, 166 may include a dielectric material such as, but is not limited to, silicon dioxide, polyimide, or TEOS. For example, the redistribution layer 168 may be include a first connection level 164 formed on the semiconductor chip 202 and a second connection level 166 formed on the first connection level 164. In particular, the first connection level 164 of the redistribution layer 168 may be formed on the interlayer dielectric level 162 of the semiconductor chip. The connection levels 164, 166 in the redistribution layer 168 may contain the interconnect features 102, 104, 106 for constructing the upper section 110 of the inductor structure 100.

The upper section 110 of the inductor structure 100 may include an outer portion 103 and an inner portion 109. The outer portion 103 may include at least one concentric turn

102 about the center region 101. The inner portion 109 may include at least one concentric turn 104, 106 about the center region 101. In some examples, as shown in FIG. 1, the inner portion 109 may include a plurality of concentric turns 104, 106. The plurality of concentric turns 104, 106 in the inner portion 109 may have an innermost concentric turn 106 and an outermost concentric turn 104. The upper section 110 of the inductor structure 100 may be connected to a first input/output (I/O) terminal 138 and a second I/O terminal 142. For example, the redistribution layer 168 may include a conductive layer 108 connected to the innermost concentric turn 106 in the inner portion 109 of the upper section 110 of the inductor structure 100. The innermost concentric turn 106 in the inner portion 109 may be joined to the conductive layer 108, in which the conductive layer 108 may be connected to the first I/O terminal 138. The at least one concentric turn 102 in the outer portion 103 of the upper section 110 of the inductor structure 100 may be connected to the second I/O terminal 142.

The conductive layer 108 may be formed in the redistribution layer 168. In particular, the conductive layer 108 may be formed in the second connection level 166. In some examples, as shown in FIG. 2A to FIG. 2D, the conductive layer 108 may be formed in the same connection level as the upper section 110 of the inductor structure 100. The conductive layer 108 may be formed in the same connection level as the concentric turns 102, 104, 106 in the upper section 110 of the inductor structure 100. The conductive layer 108 may be formed using similar processes as the formation of the inductor structure 100 using the deposition techniques and patterning techniques described herein.

Figure 3:
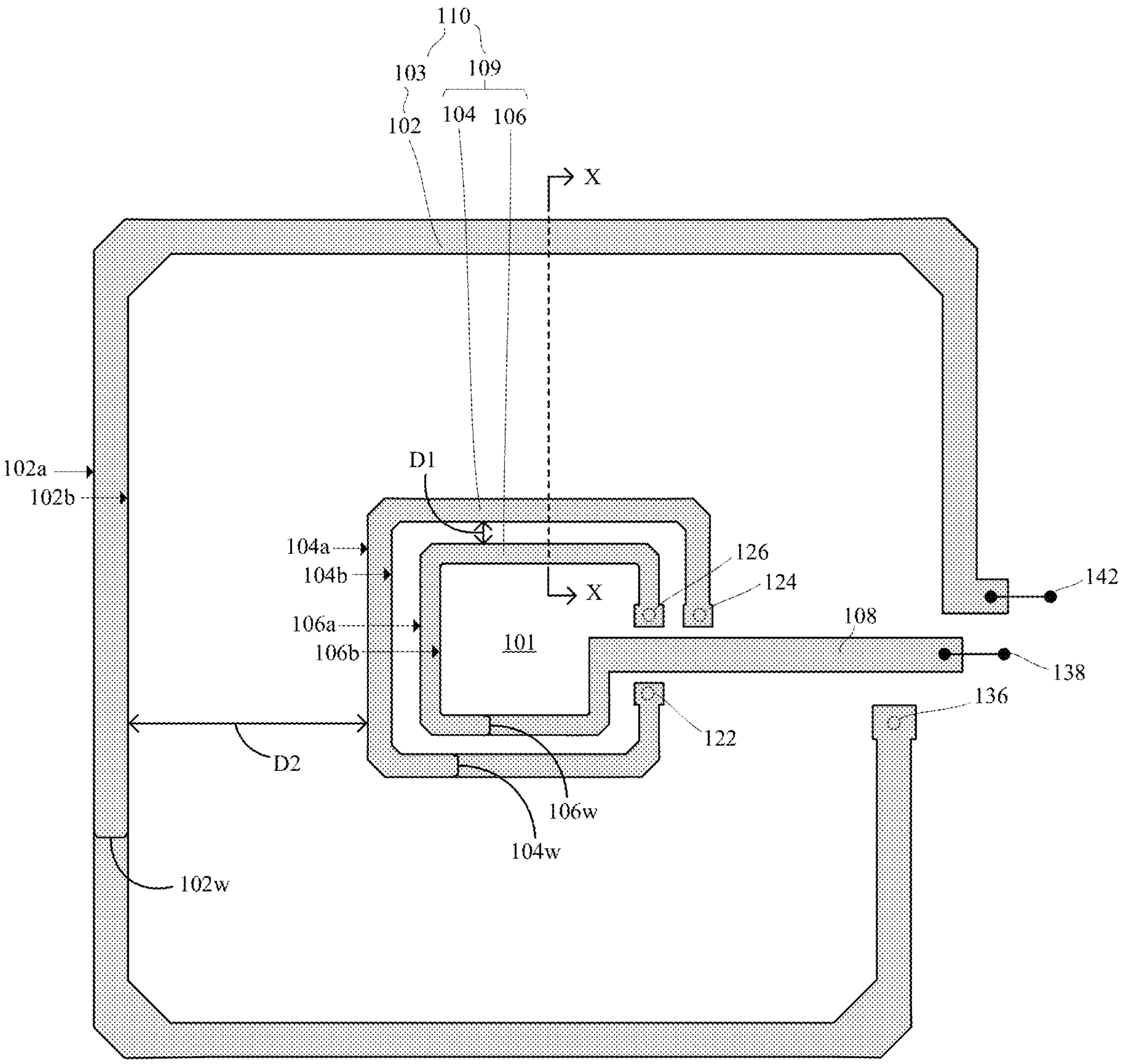
FIG. 3 is a top-down view of a connection level within a redistribution layer of the semiconductor device which contains an upper section of the example inductor structure shown in FIG. 1.
Figure 4:
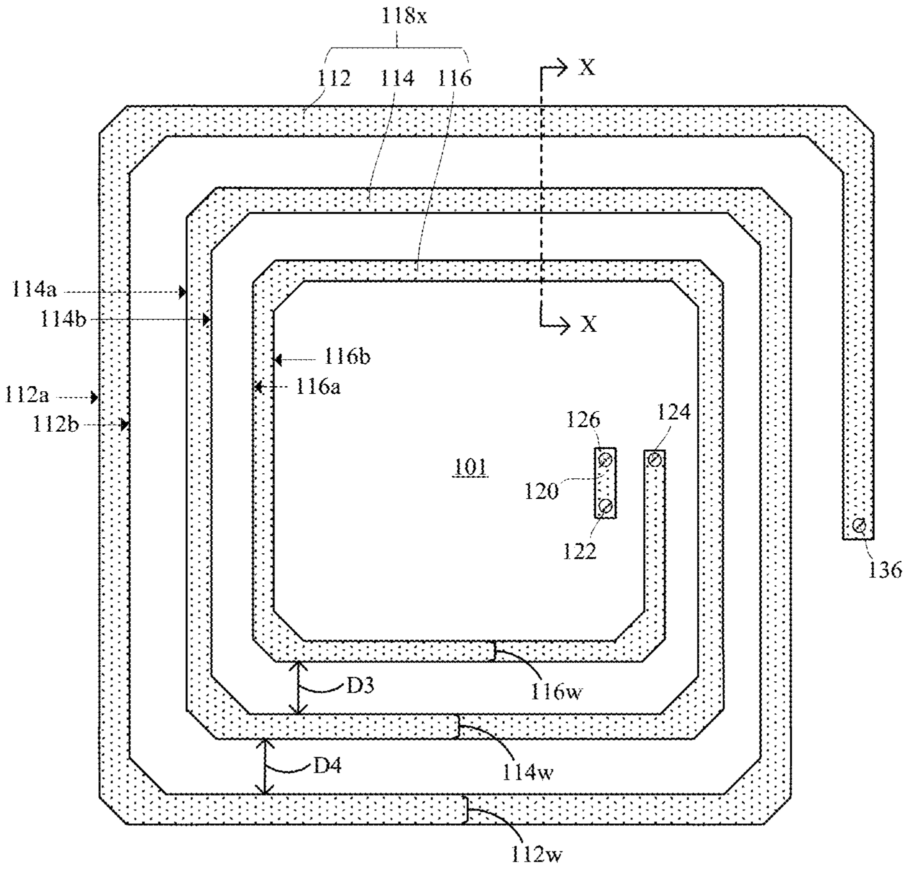
FIG. 4 is a top-down view of an interlayer dielectric level within a semiconductor chip of the semiconductor device which contains an uppermost spiral level of the lower section of the example inductor structure shown in FIG. 1.

Referring to FIG. 2A, FIG. 3, and FIG. 4, the innermost concentric turn 106 of the inner portion 109 of the upper section 110 of the inductor structure 100 may be connected to the outermost concentric turn 104 of the inner portion 109 of the upper section 110 of the inductor structure 100 through a connection line 120 in the interlayer dielectric level 162 in the semiconductor chip 202. The connection line 120 in the interlayer dielectric level 162 may be connected to the outermost concentric turn 104 and the innermost concentric turn 106 by contact structures 122, 126, respectively. The contact structures 122, 126 may be formed in the first connection level 164 in the redistribution layer 168. The connection line 120 may be positioned below the conductive layer 108 such that the conductive layer 108 in the connection level 166 of the redistribution layer 168 may extend over and across the connection line 120 in the interlayer dielectric level 162 of the semiconductor chip 202. In an example, the connection line 120 may be perpendicular to the conductive layer 108.

Referring to FIG. 2A to FIG. 2D and FIG. 4 to FIG. 6, the lower section 118 of the inductor structure 100 may include at least one concentric turn 112, 114, 116, 112', 114', 112" or a plurality of concentric turns 112, 114, 116, 112', 114', 112" about the center region 101. The lower section 118 of the inductor structure 100 may also include a plurality of spiral levels 118*x*, 118*y*, 118*z*. Each spiral level 118*x*, 118*y*, 118*z* may include at least one concentric turn about the center region. In examples where a spiral level in the plurality of spiral levels 118*x*, 118*y*, 118*z* has more than one concentric turn, the more than one concentric turn may adjoin each other to form a continuous coil in that spiral level. The spiral levels 118*x*, 118*y*, 118*z* may be stacked vertically over each other. The plurality of spiral levels of the lower section 118 of the inductor structure 100 may have an uppermost spiral level 118*x*, an intermediate spiral level 118*y*, and a lowermost spiral level 118*z*. Although not shown, it should be noted that the scope of this disclosure also includes examples where the plurality of spiral levels has more than one intermediate spiral levels positioned vertically between the uppermost spiral level and the lowermost spiral level. The at least one concentric turn in each spiral level 118*x*, 118*y*, 118*z* may be formed in the same interlayer dielectric level of the semiconductor chip 202. The at least one concentric turn in a spiral level 118*x*, 118*y*, 118*z* may be connected to the at least one concentric turn in a vertically adjacent spiral level 118*x*, 118*y*, 118*z*.

As illustrated in FIG. 2A to FIG. 2D and FIG. 4, the uppermost spiral level 118*x* may have an innermost concentric turn 116, an intermediate concentric turn 114, and an outermost concentric turn 112. The concentric turns 112, 114, 116 in the uppermost spiral level 118*x* may be formed in the interlayer dielectric level 162. In an example, the concentric turns 112, 114, 116 in the uppermost spiral level 118*x* may be formed in the same interlayer dielectric level 162 as the connection line 120 that provides the connection between the innermost concentric turn 106 of the inner portion 109 of the upper section 110 of the inductor structure 100 and the outermost concentric turn 104 of the inner portion 109 of the upper section 110 of the inductor structure 100. The concentric turns 112, 114, 116 may adjoin each other to form a continuous coil in the uppermost spiral level 118*x*.

As illustrated in FIG. 2A to FIG. 2D and FIG. 5, the intermediate spiral level 118*y* may have an innermost concentric turn 114' and an outermost concentric turn 112'. The concentric turns 112', 114' in the intermediate spiral level 118*y* may be formed in the interlayer dielectric level 158. The concentric turns 112', 114' may adjoin each other to form a continuous coil in the intermediate spiral level 118*y*. The innermost concentric turn 114' in the intermediate spiral level 118*y* overlap with the intermediate concentric turn 114 in the uppermost spiral level 118*x* such that the innermost concentric turn 114' in the intermediate spiral level 118*y* may be aligned vertically below the intermediate concentric turn 114 in the uppermost spiral level 118*x*. The innermost concentric turn 114' in the intermediate spiral level 118*y* may be connected to the intermediate concentric turn 114 in the uppermost spiral level 118*x* by a via structure 151. The outermost concentric turn 112' in the intermediate spiral level 118*y* overlap with the outermost concentric turn 112 in the uppermost spiral level 118*x* such that the outermost concentric turn 112' in the intermediate spiral level 118*y* may be aligned vertically below the outermost concentric turn 112 in the uppermost spiral level 118*x*. The outermost concentric turn 112' in the intermediate spiral level 118*y* may be connected to the outermost concentric turn 112 in the uppermost spiral level 118*x* by a via structure 150.

As illustrated in FIG. 2A to FIG. 2D and FIG. 6, the lowermost spiral level 118*z* may have a concentric turn 112". The concentric turn 112" in the lowermost spiral level 118*z* may be formed in the interlayer dielectric level 154. The concentric turn 112" in the lowermost spiral level 118*z* may overlap with the outermost concentric turn 112' in the intermediate spiral level 118*y* such that the concentric turn 112" in the lowermost spiral level 118*z* may be aligned vertically below the outermost concentric turn 112' in the intermediate spiral level 118*y*. The concentric turn 112" in the lowermost spiral level 118*z* may be connected to the outermost concentric turn 112' in the intermediate spiral level 118*y* by a via structure 152.

Figure 5:
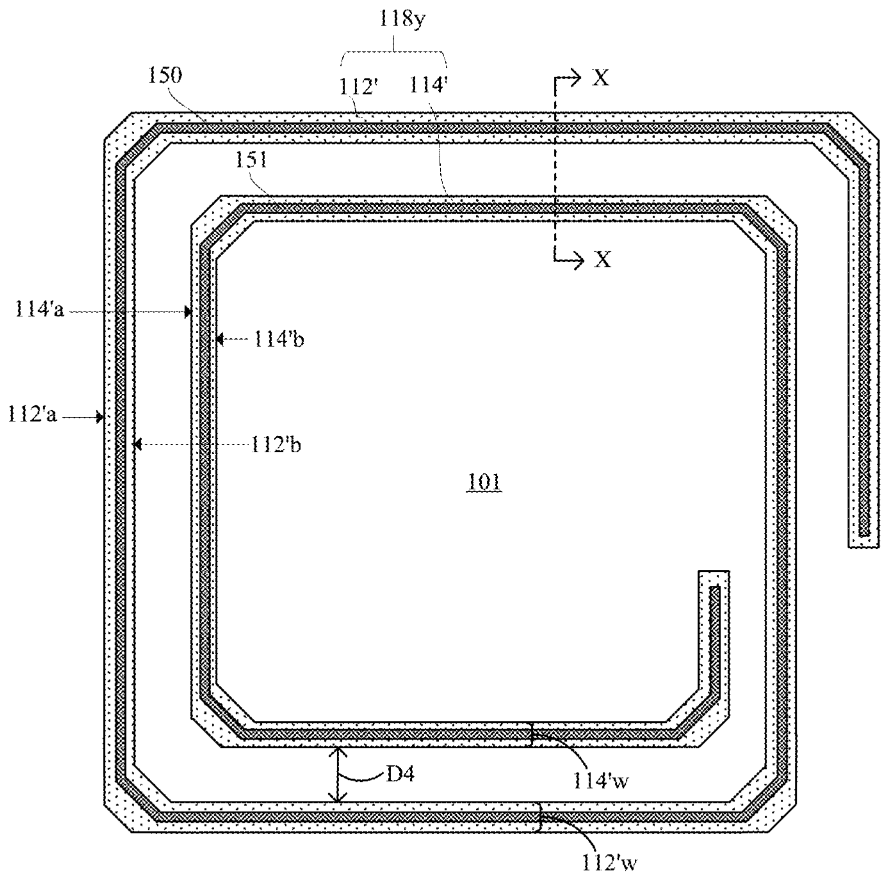
FIG. 5 is a top-down view of an interlayer dielectric level within a semiconductor chip of the semiconductor device which contains an intermediate spiral level of the lower section of the example inductor structure shown in FIG. 1.
Figure 6:
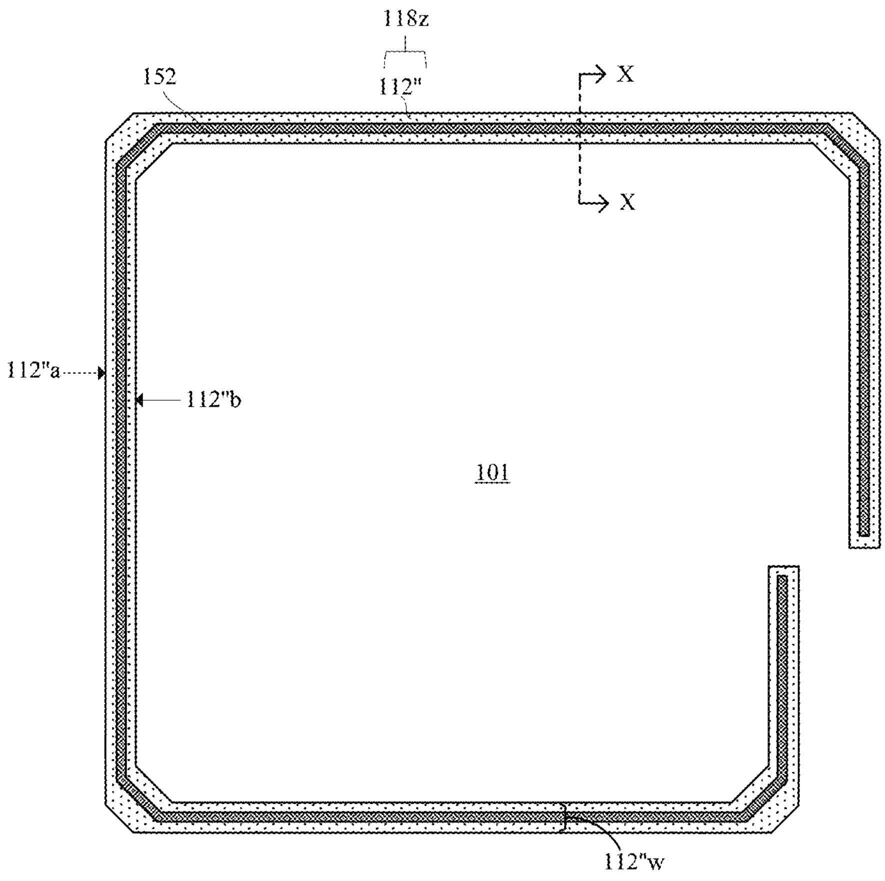
FIG. 6 is a top-down view of an interlayer dielectric level within a semiconductor chip of the semiconductor device which contains a lowermost spiral level of the lower section of the example inductor structure shown in FIG. 1.

As shown in FIG. 5 and FIG. 6, the via structures 150, 151, 152 may be structured to extend along the length of the respective concentric turns that they connect to. In other words, the via structures 150, 151, 152 may be elongated along the length of the respective concentric turns that they connect to as opposed to being a substantially cylindrical structure. For example, the via structure 150 may be structured as a concentric turn in which a length of the via structure 150 traces a length of the concentric turn 112'. The length of the via structure 150 may be the same or less than the length of the concentric turn 112'. The via structures 150, 151 formed in the same interlayer dielectric level 160 may adjoin each other to form a continuous structure in the interlayer dielectric level 160.

As described herein, the lower section 118 of the inductor structure 100 may be connected to the upper section 110 of the inductor structure 100. In an example, the at least one concentric turn in the upper section 110 of the inductor structure 100 may be connected to the at least one concentric turn in the lower section 118 of the inductor structure 100. In another example, the at least one concentric turn in the upper section 110 of the inductor structure 100 may be connected to the at least one concentric turn in the uppermost spiral level 118*x* of the lower section 118 of the inductor structure 100.

As shown in FIG. 2B, FIG. 3, and FIG. 4, the outermost concentric turn 104 in the inner portion 109 of the upper section 110 of the inductor structure 100 may be connected to the innermost concentric turn 116 in the uppermost spiral level 118*x* of the lower section 118 of the inductor structure 100 by a contact structure 124 formed in the first connection level 164 in the redistribution layer 168. The contact structure 124 may contact or directly contact the innermost concentric turn 116 and the outermost concentric turn 104.

As shown in FIG. 2C, FIG. 3, and FIG. 4, the at least one concentric turn 102 in the outer portion 103 of the upper section 110 of the inductor structure 100 may be connected to the outermost concentric turn 112 in the uppermost spiral level 118*x* of the lower section 118 of the inductor structure 100 by a contact structure 136 formed in the first connection level 164 in the redistribution layer 168. The contact structure 136 may contact or directly contact the concentric turn 102 and the outermost concentric turn 112.

As shown in FIG. 1 and FIG. 2D, the conductive layer 108 may extend over and across the at least one concentric turn 112, 114, 116, 112', 114', 112" in the lower section 118 of the inductor structure 100 and the connection line 120 in the interlayer dielectric level 162. The extension of the conductive layer 108 may begin from the innermost concentric turn 106 in the inner portion 109 of the upper section 110 of the inductor structure 100.

Figure 3A:
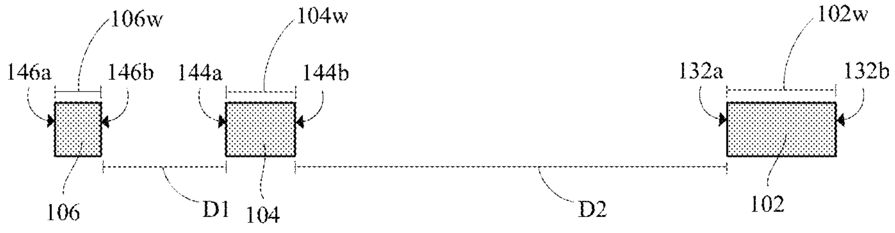
FIG. 3A is a cross-sectional view of the concentric turns taken along line X-X in FIG. 3.

Referring to FIG. 3 and FIG. 3A, the at least one concentric turn in the upper section 110 of the inductor structure 100 may have a width and may have a perimeter. The perimeter of the concentric turn may include an inner perimeter and an outer perimeter. The width of the concentric turn may be measured as a spacing between two oppositely facing lateral sides of the concentric turn. The two opposing lateral side may be an inner lateral side and an outer lateral side, in which the inner lateral side may be closer to the center region 101 as compared to the outer lateral side and the inner lateral side may be parallel to the outer lateral side. The inner perimeter may be measured as a length along the inner lateral side while the outer perimeter may be measured as a length along the outer lateral side. Accordingly, in each concentric turn, its inner perimeter may be smaller than its outer perimeter. In examples where the upper section 110 of the inductor structure 100 has a plurality of concentric turns, the respective width of each concentric turn decreases as the concentric turns wind towards the center region 101 of the inductor structure 100. In other words, the respective widths of the concentric turns may decrease from the outermost concentric turn to the innermost concentric turn. The plurality of concentric turns may also have interspacing or distance between concentric turns. The distance or the interspacing between the concentric turns may decrease as the concentric turns wind towards the center region 101 of the inductor structure 100.

As shown in FIG. 3 and FIG. 3A, the concentric turn 102 in the outer portion 103 of the upper section 110 may have a width 102*w*, an inner perimeter 102*b*, and an outer perimeter 102*a*. The outermost concentric turn 104 in the inner portion 109 may have a width 104*w*, an inner perimeter 104*b*, and an outer perimeter 104*a*. The innermost concentric turn 106 in the inner portion 109 may have a width 106*w*, an inner perimeter 106*b*, and an outer perimeter 106*a*. The width 106*w* may be measured as a distance between the inner lateral side 146*a* and the outer lateral side 146*b* of the concentric turn 106. The width 104*w* may be measured as a distance between the inner lateral side 144*a* and the outer lateral side 144*b* of the concentric turn 104. The width 102*w* may be measured as a distance between the inner lateral side 132*a* and the outer lateral side 132*b* of the concentric turn 102. The widths 102*w*, 104*w*, 106*w* may decrease as the concentric turns wind from the concentric turn 102 in the outer portion 103 to the innermost concentric turn 106 in the inner portion 109. In other words, the innermost concentric turn 106 may have a smaller width than the outermost concentric turn 104. The at least one concentric turn 102 in the outer portion 103 may have a larger width than the outermost concentric turn 104 in the inner portion 109. The innermost concentric turn 106 may have a smaller perimeter than the outermost concentric turn 104. The at least one concentric turn 102 in the outer portion 103 may have a larger perimeter than the outermost concentric turn 104 in the inner portion 109.

In examples where the upper section 110 of the inductor structure 100 has a plurality of concentric turns, the concentric turns may be spaced apart from each other by respective distances D1, D2. As shown in FIG. 3, the innermost concentric turn 106 in the inner portion 109 may be spaced apart from the outermost concentric turn 104 in the inner portion 109 by a distance D1. The outermost concentric turn 104 in the inner portion 109 may be spaced apart from the concentric turn 102 in the outer portion 103 by a distance D2. The distance D2 may be greater than the distance D1.

Referring to FIG. 4, FIG. 4A, FIG. 5, FIG. 5A, FIG. 6, and FIG. 6A, the at least one concentric turn in the lower section 118 of the inductor structure 100 may have a width and a perimeter. The perimeter of the concentric turn may include an inner perimeter and an outer perimeter. The width of the concentric turn may be measured as a distance between two oppositely facing lateral sides of the concentric turn. The two opposing lateral side may be an inner lateral side and an outer lateral side, in which the inner lateral side may be closer to the center region 101 as compared to the outer lateral side and the inner lateral side may be parallel to the outer lateral side. The inner perimeter may be measured as a length along the inner lateral side while the outer perimeter may be measured as a length along the outer lateral side. Accordingly, in each concentric turn, its inner perimeter may be smaller than its outer perimeter. In examples where the lower section 118 of the inductor structure 100 has a plurality of concentric turns, the respective width of each concentric turn decreases as the concentric turns wind towards the center region 101 of the inductor structure 100.

In other words, the respective widths of the concentric turns may decrease from the outermost concentric turn to the innermost concentric turn. The plurality of concentric turns may also have interspacing or distance between concentric turns. The distance or the interspacing between the concentric turns may decrease as the concentric turns wind towards the center region 101 of the inductor structure 100.

Figure 4A:
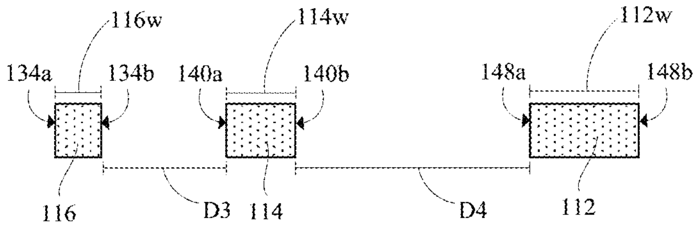
FIG. 4A is a cross-sectional view of the concentric turns taken along line X-X in FIG. 4.

As shown in FIG. 4 and FIG. 4A, in the uppermost spiral level 118$x$ of the lower section 118 of the inductor structure 100, the innermost concentric turn 116 may have a width 116$w$, an outer perimeter 116$a$, and an inner perimeter 116$b$. The intermediate concentric turn 114 may have a width 114$w$, an outer perimeter 114$a$, and an inner perimeter 114$b$. The outermost concentric turn 112 may have a width 112$w$, an outer perimeter 112$a$, and an inner perimeter 112$b$. The width 116$w$ may be measured as a distance between the inner lateral side 134$a$ and the outer lateral side 134$b$ of the concentric turn 116. The width 114$w$ may be measured as a distance between the inner lateral side 140$a$ and the outer lateral side 140$b$ of the concentric turn 114. The width 112$w$ may be measured as a distance between the inner lateral side 148$a$ and the outer lateral side 148$b$ of the concentric turn 112. The widths 112$w$, 114$w$, 116$w$ may decrease as the concentric turns wind from the outermost concentric turn 112 to the innermost concentric turn 116. In other words, the innermost concentric turn 116 may have a smaller width than the intermediate concentric turn 114, while the intermediate concentric turn 114 may have a smaller width than the outermost concentric turn 112. The innermost concentric turn 116 may have a smaller perimeter than the intermediate concentric turn 114, while the intermediate concentric turn 114 may have a smaller perimeter than the outermost concentric turn 112. The concentric turns 112, 114, 116 may be spaced apart from each other by respective distances D4, D3. The innermost concentric turn 116 may be spaced apart from the intermediate concentric turn 114 by a distance D3. The intermediate concentric turn 114 may be spaced apart from the outermost concentric turn 112 by a distance D4. The distance D4 may be greater than the distance D3.

Figure 5A:
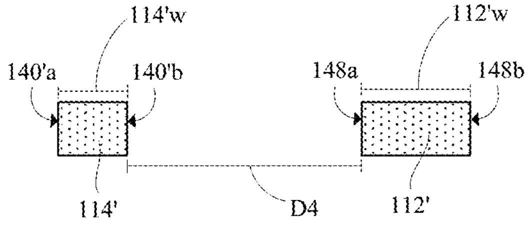
FIG. 5A is a cross-sectional view of the concentric turns taken along line X-X in FIG. 5.

As shown in FIG. 5 and FIG. 5A, in the intermediate spiral level 118$y$ of the lower section 118 of the inductor structure 100, the innermost concentric turn 114' may have a width 114'$w$, an outer perimeter 114'$a$, and an inner perimeter 114'$b$. The outermost concentric turn 112' may have a width 112'$w$, an outer perimeter 112'$a$, and an inner perimeter 112'$b$. The width 114'$w$ may be measured as a distance between the inner lateral side 140'$a$ and the outer lateral side 140'$b$ of the concentric turn 114'. The width 112'$w$ may be measured as a distance between the inner lateral side 148'$a$ and the outer lateral side 148'$b$ of the concentric turn 112'. The widths 112'$w$, 114'$w$ may decrease as the concentric turns wind from the outermost concentric turn 112' to the innermost concentric turn 114'. In other words, the innermost concentric turn 114' may have a smaller width than the outermost concentric turn 112'. The innermost concentric turn 114' may have a smaller perimeter than the outermost concentric turn 112'. The concentric turns 112', 114' in the intermediate spiral level 118$y$ may be spaced apart from each other by the same distance between the outermost concentric turn 112 in the uppermost spiral level 118$x$ and the intermediate concentric turn 114 in the uppermost spiral level 118$x$, i.e., the distance D4. For simplicity, the via structures 150, 151 are not illustrated in FIG. 5A.

Figure 6A:
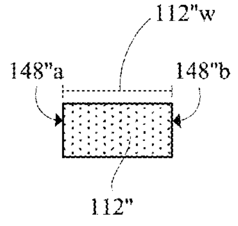
FIG. 6A is a cross-sectional view of the concentric turn taken along line X-X in FIG. 6.

As shown in FIG. 6 and FIG. 6A, in the lowermost spiral level 118$z$ of the lower section 118 of the inductor structure 100, the concentric turn 112" may have a width 112"$w$, an outer perimeter 112"$a$, and an inner perimeter 112"$b$. The width 112"$w$ may be measured as a distance between the inner lateral side 148"$a$ and the outer lateral side 148"$b$ of the concentric turn 112". For simplicity, the via structure 152 is not illustrated in FIG. 6A.

Referring again to FIG. 4, FIG. 5, and FIG. 6, in some examples, the width and the perimeters of the concentric turns aligned vertically below the outermost concentric turn 112 in the uppermost spiral level 118$x$ may have substantially the same value. In other words, widths 112$w$, 112'$w$, 112"$w$ may be of the same value and perimeters 112$a$, 112$b$, 112'$a$, 112'$b$, 112"$a$ may be of the same value. Likewise, the width and the perimeters of the concentric turns aligned vertically below the intermediate concentric turn 114 in the uppermost spiral level 118$x$ may have substantially the same value. In other words, widths 114$w$, 114'$w$ may be of the same value and perimeters 114$a$, 114$b$, 114'$a$, 114'$b$ may be of the same value. The number of concentric turns in a spiral level may decrease as the spiral levels move from the uppermost spiral level 118$x$ to the lowermost spiral level 118$z$. The number of concentric turns aligned vertically below each concentric turn in the uppermost spiral level 118$x$ may decrease as the concentric turns move from the outermost concentric turn 112 in the uppermost spiral level 118$x$ to the innermost concentric turn 116 in the uppermost spiral level 118$x$.

Referring again to FIG. 1, FIG. 3, and FIG. 4, the lower section 118 of the inductor structure 100 may be positioned laterally between the outer portion 103 in the upper section 110 of the inductor structure 100 and the inner portion 109 in the upper section 110 of the inductor structure 100. For example, the concentric turns 104, 106 in the inner portion 109 of the upper section 110 of the inductor structure 100 may have a smaller perimeter than the at least one concentric turn 112, 114, 116 in the lower section 118 of the inductor structure 100. In another example, the innermost concentric turn 116 in the uppermost spiral level 118$x$ of the lower section 118 of the inductor structure 100 may have a larger perimeter than the outermost concentric turn 104 in the inner portion 109 of the upper section 110 of the inductor structure 100. Accordingly, the innermost concentric turn 116 in the uppermost spiral level 118$x$ of the lower section 118 of the inductor structure 100 may not overlap or may not be covered by the outermost concentric turn 104 in the inner portion 109 of the upper section 110 of the inductor structure 100. The outermost concentric turn 112 in the uppermost spiral level 118$x$ of the lower section 118 of the inductor structure may preferably have a smaller perimeter than the at least one concentric turn 102 in the outer portion 103 of the upper section 110 of the inductor structure 100. Accordingly, the outermost concentric turn 112 in the uppermost spiral level 118$x$ of the lower section 118 of the inductor structure 100 may not overlap or may not be covered by the at least one concentric turn 102 in the outer portion 103 of the upper section 110 of the inductor structure 100.

Figure 7:
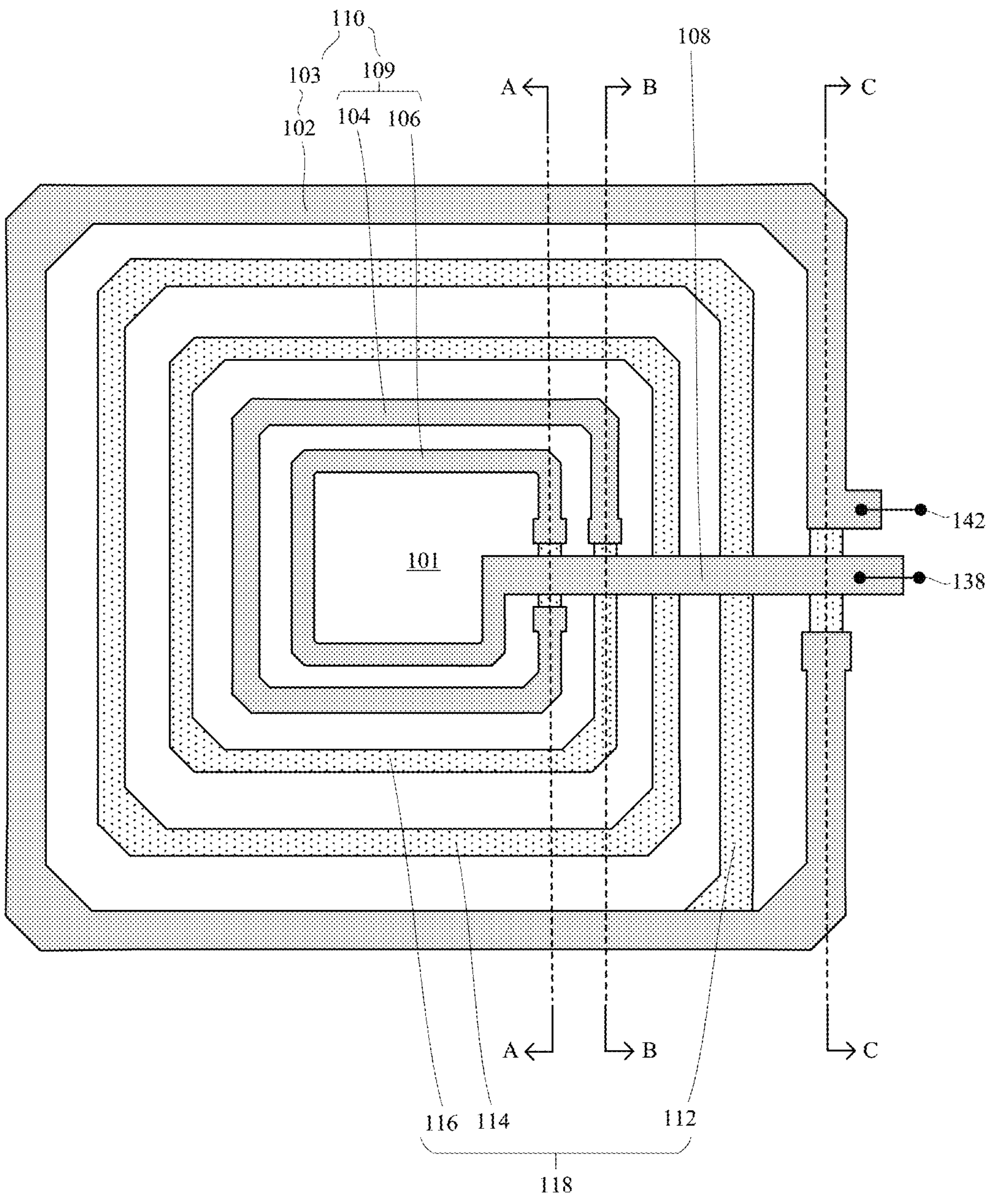
FIG. 7 is a top-down view of another example inductor structure integrated in a semiconductor device.
Figure 8A:
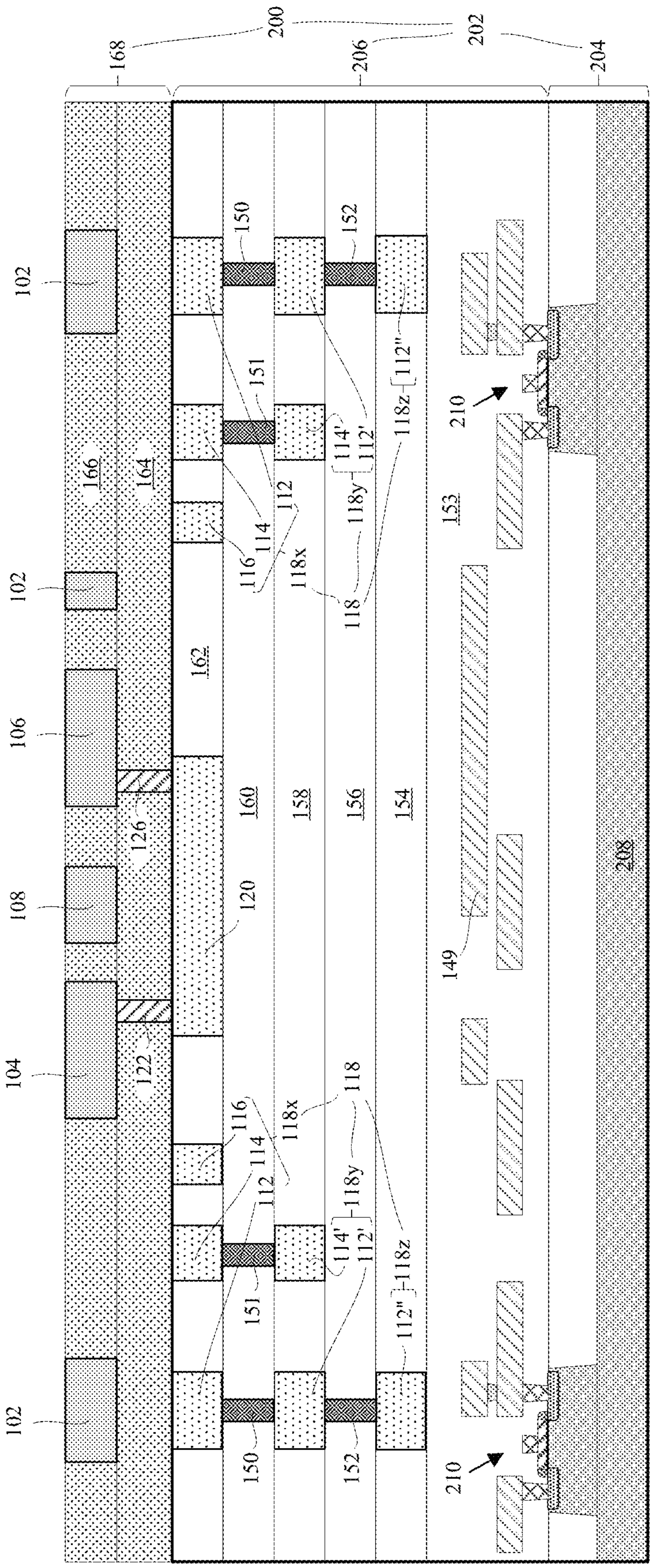
FIG. 8A to FIG. 8C are cross-sectional views of the semiconductor device having the example inductor structure shown in FIG. 7.
Figure 8B:
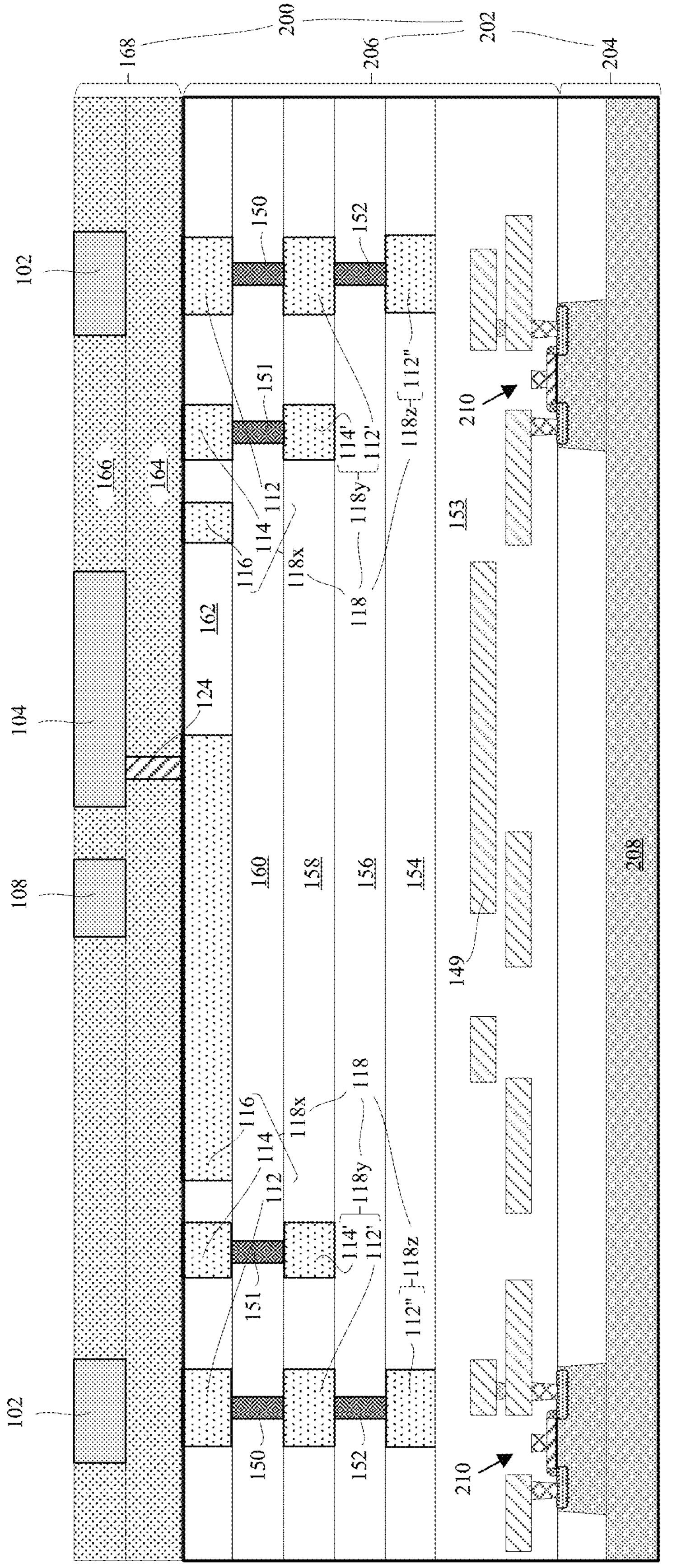
Figure 8C:
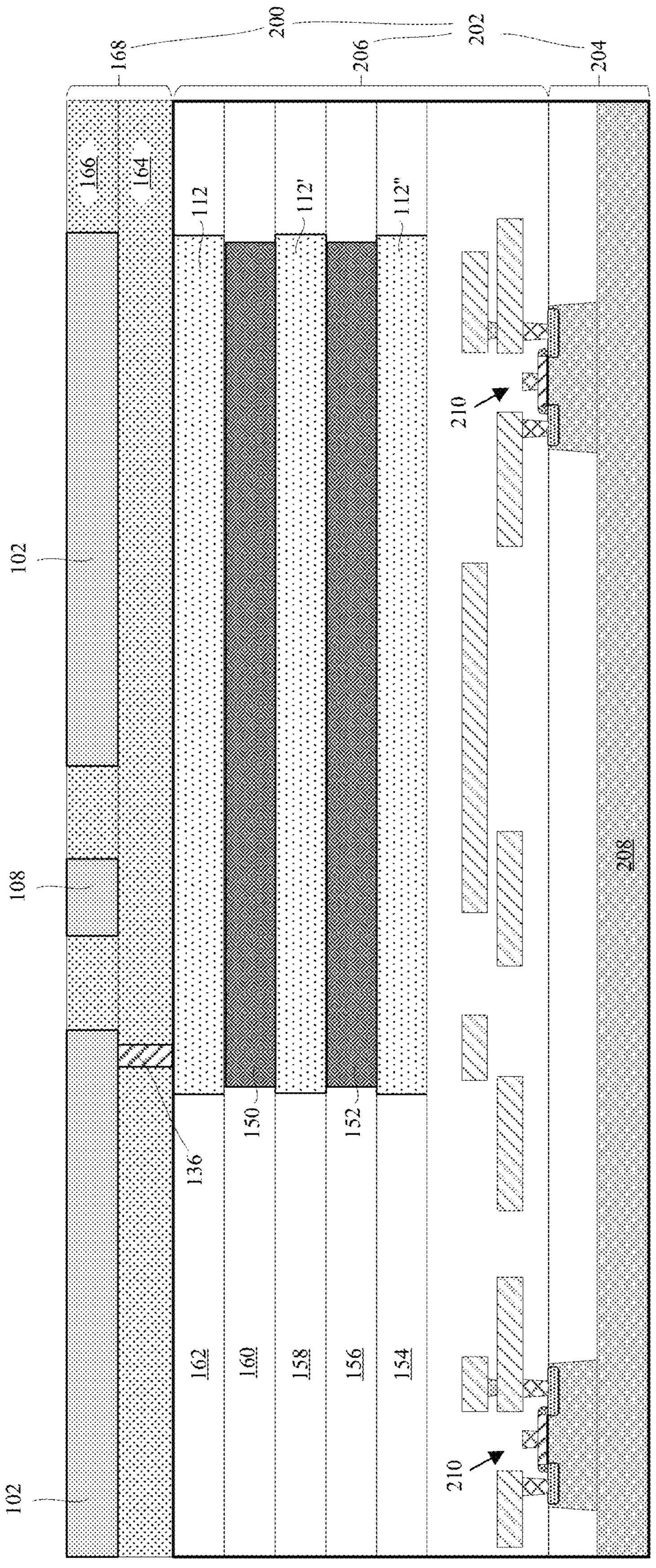

FIG. 7 illustrates a top-down view of another example inductor structure integrated in a semiconductor device while FIG. 8A through FIG. 8C are cross-sectional views of the semiconductor device having the example inductor structure shown in FIG. 7. FIG. 8A is the cross-sectional view taken along line A-A in FIG. 2. FIG. 8B is the cross-sectional view taken along line B-B in FIG. 7. FIG. 8C is the cross-sectional view taken along line C-C in FIG. 7.

Referring to FIG. 7, FIG. 8A to FIG. 8C, in which like reference numerals refer to like features in FIG. 1, FIG. 2A to FIG. 2C, respectively, the at least one concentric turn 102 in the outer portion 103 of the upper section 110 of the inductor structure 100 may be above and overlapping with the at least one concentric turn 112 in the lower section 118 of the inductor structure 100. In an example, the concentric turn 102 in the outer portion 103 of the upper section 110 of the inductor structure 100 may be aligned vertically above the outermost concentric turn 112 in the uppermost spiral level 118*x* of the lower section 118 of the inductor structure 100. Preferably, as shown in FIG. 8A to FIG. 8C, the concentric turns 112', 112" aligned vertically below the outermost concentric turn 112 in the uppermost spiral level 118*x* of the lower section 118 of the inductor structure 100 may also be aligned vertically below the concentric turn 102 in the outer portion 103 of the upper section 110 of the inductor structure 100.

Figure 9:
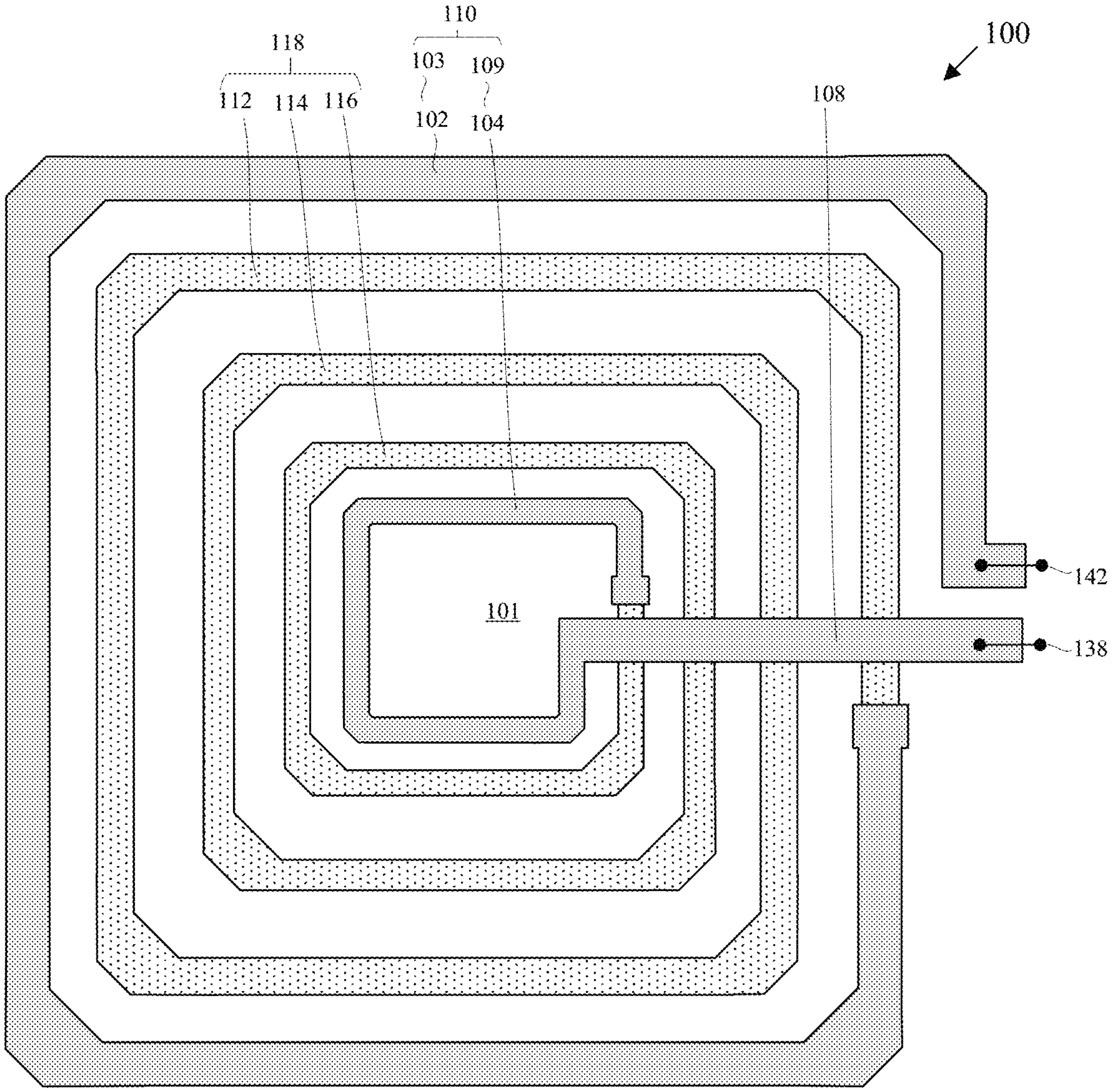
FIG. 9 is a top-down view of another example inductor structure integrated in a semiconductor device.

Referring to FIG. 9, in which like reference numerals refer to like features in FIG. 1, another example of an inductor structure integrated in a semiconductor device is shown. In this example, the upper section 110 of the inductor structure 100 may have an outer portion 103 and an inner portion 109, in which the outer portion 103 may have a single concentric turn 102 and the inner portion 109 may have a single concentric turn 104. The concentric turn 104 in the inner portion 109 of the upper section 110 of the inductor structure 100 may be connected to the innermost concentric turn 116 in the lower section 118 of the inductor structure 100. The concentric turn 102 in the outer portion 103 of the upper section 110 of the inductor structure 100 may be connected to the outermost concentric turn 112 in the lower section 118 of the inductor structure 100.

Figure 10:
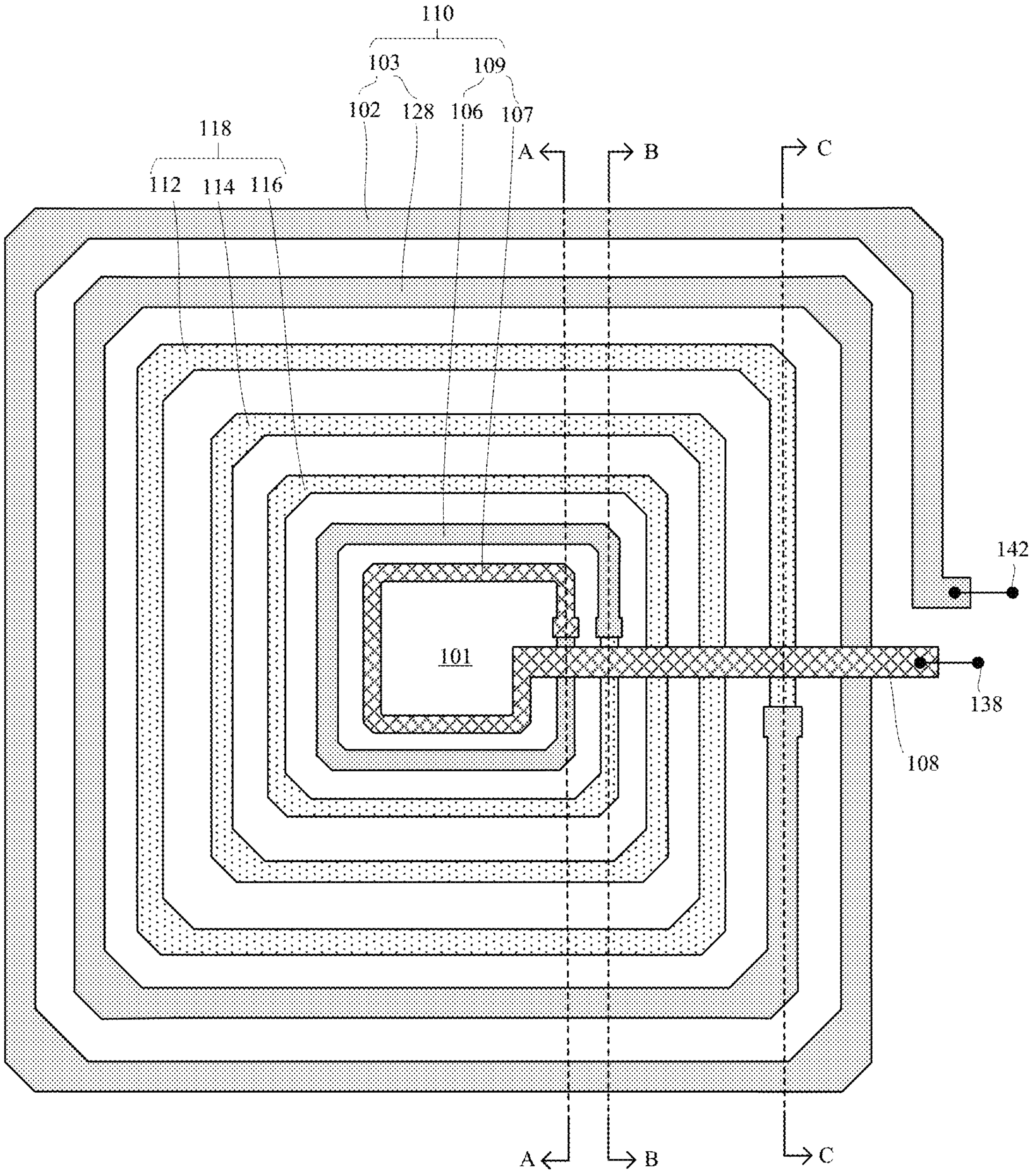
FIG. 10 is a top-down view of another example inductor structure integrated in a semiconductor device.

Referring to FIG. 10, in which like reference numerals refer to like features in FIG. 1, another example of an inductor structure integrated in a semiconductor device is shown. In this example, the upper section 110 of the inductor structure 100 may have an outer portion 103 and an inner portion 109. Each of the outer portion 103 and the inner portion 109 may have a plurality of concentric turns about the center region 101. For example, the outer portion 103 may have an innermost concentric turn 128 and an outermost concentric turn 102. The inner portion 109 may have an innermost concentric turn 107 and an outermost concentric turn 106. The innermost concentric turn 107 in the inner portion 109 may have a smaller perimeter than the outermost concentric turn 106 in the inner portion 109.

Figure 11A:
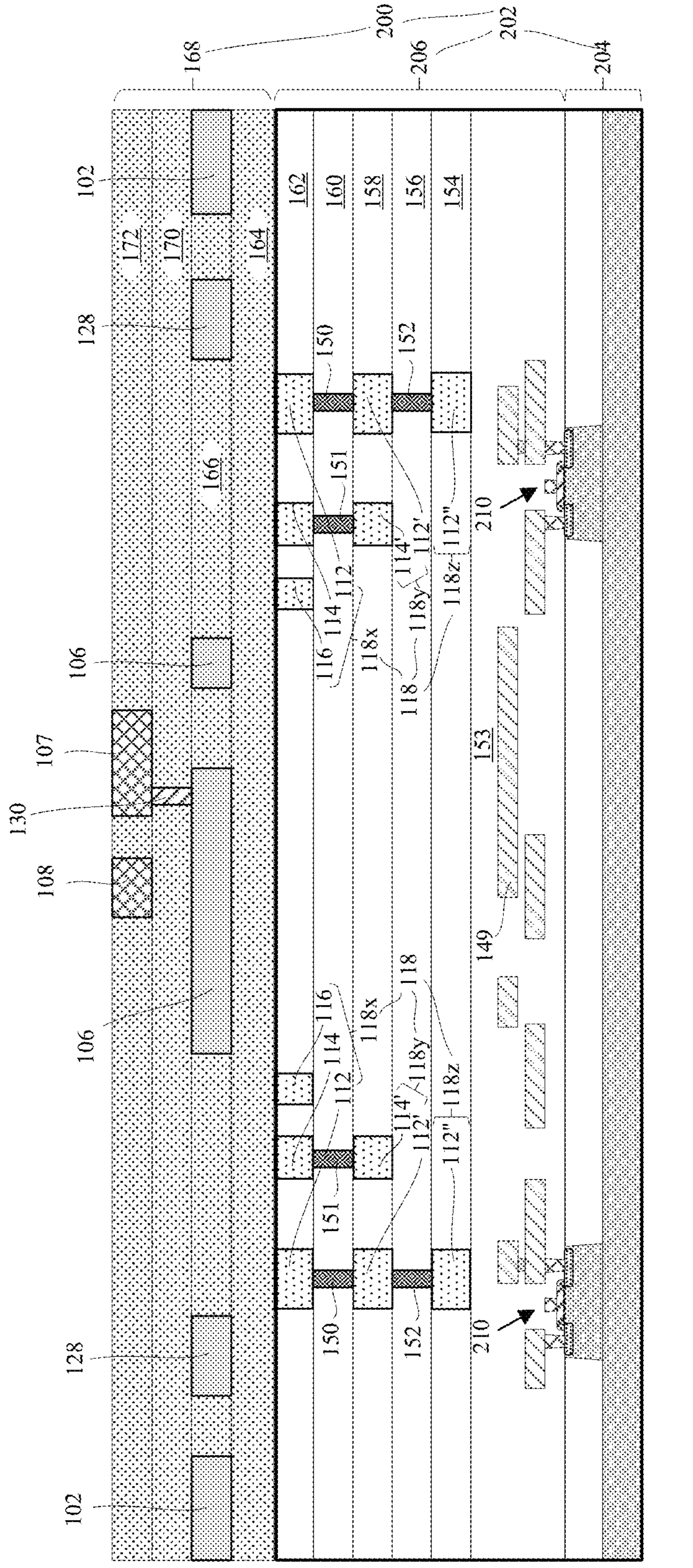
FIG. 11A to FIG. 11C are cross-sectional views of the semiconductor device having the example inductor structure shown in FIG. 10.
Figure 11B:
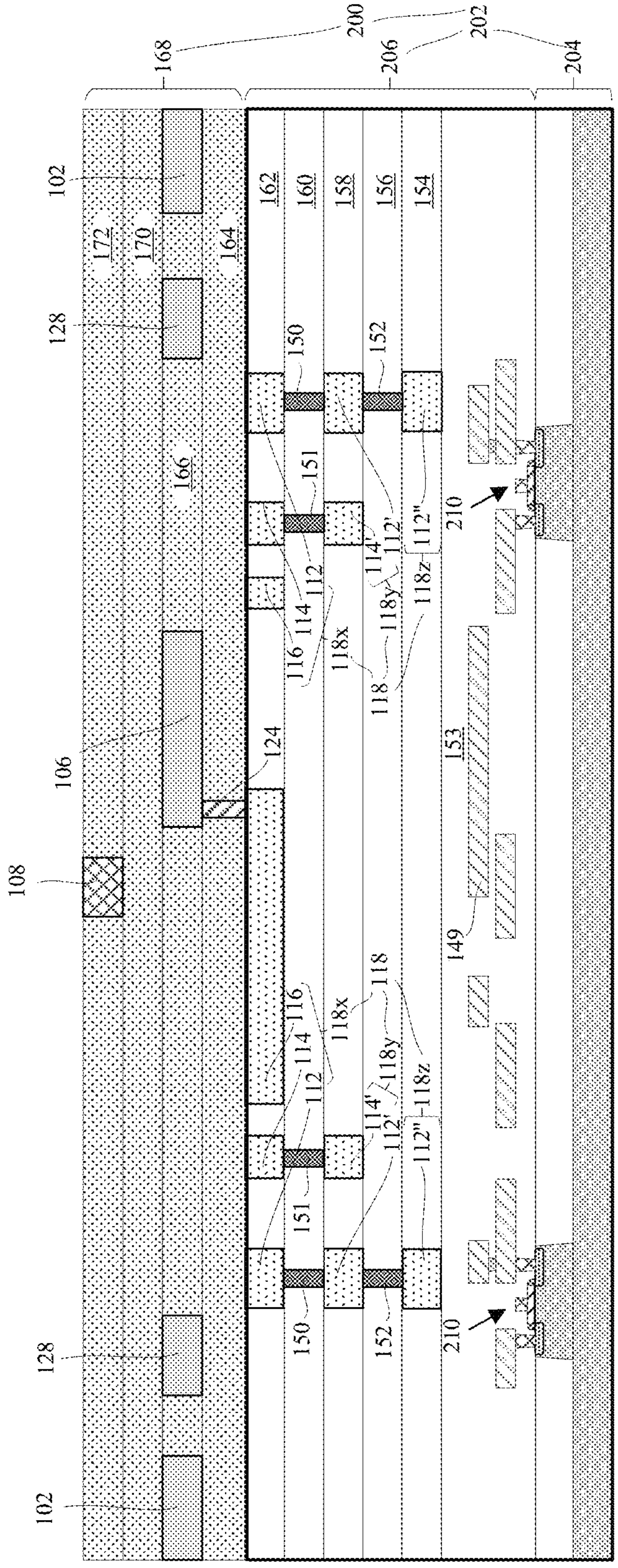
Figure 11C:
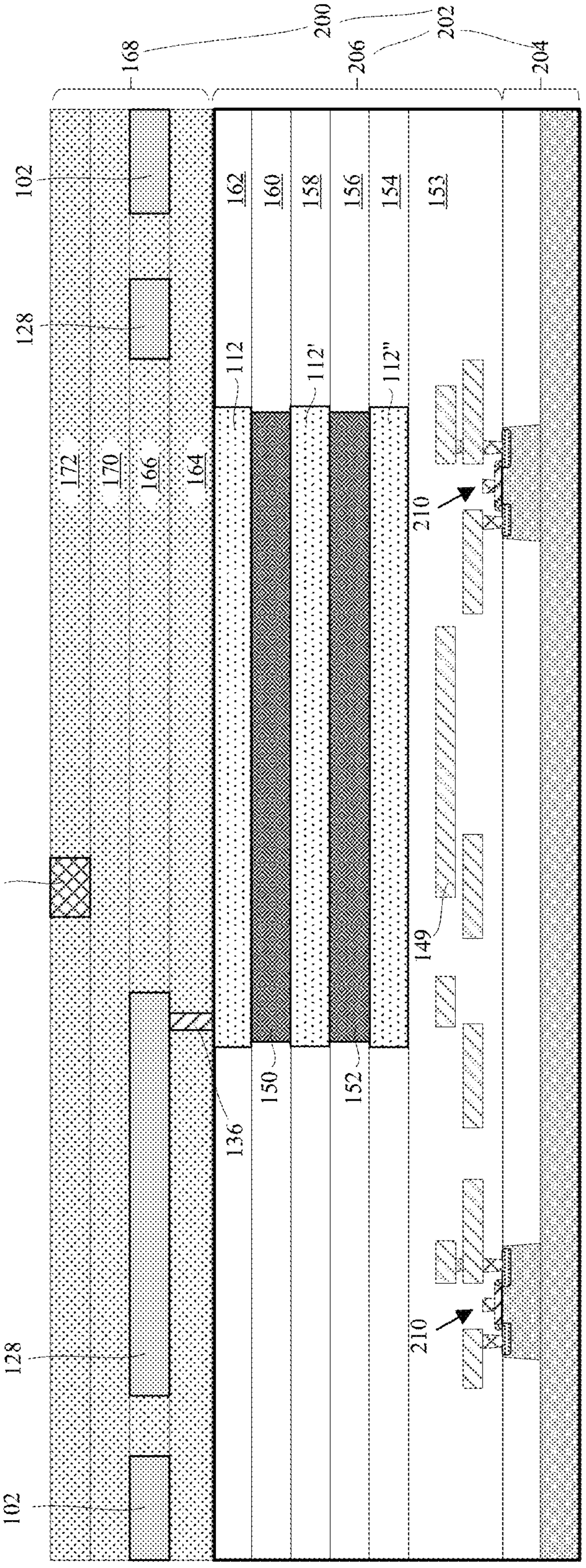

FIG. 11A through FIG. 11C are cross-sectional views of the semiconductor device having the example inductor structure shown in FIG. 10. FIG. 11A is the cross-sectional view taken along line A-A in FIG. 10. FIG. 11B is the cross-sectional view taken along line B-B in FIG. 10. FIG. 11C is the cross-sectional view taken along line C-C in FIG. 10.

Referring to FIG. 10, and FIG. 11A to FIG. 11C, in which like reference numerals refer to like features in FIG. 1, FIG. 2A to FIG. 2C, respectively, the redistribution layer 168 being formed on the semiconductor chip 202 may include a plurality of connection levels 164, 166, 170, 172. For example, the redistribution layer 168 may be include a first connection level 164 formed on the semiconductor chip 202, a second connection level 166 formed on the first connection level 164, a third connection level 170 formed on the second connection level 166, and a fourth connection level 172 formed on the third connection level 170.

As shown in FIG. 10 and FIG. 11A, the innermost concentric turn 107 in the inner portion 109 may be formed in the same connection level as the conductive layer 108, e.g., connection level 172. The innermost concentric turn 107 may be connected to the conductive layer 108. The innermost concentric turn 107 in the inner portion 109 may be above the outermost concentric turn 106 in the inner portion 109. As shown, the innermost concentric turn 107 may be formed in a different connection level from the outermost concentric turn 106. The innermost concentric turn 107 may be connected to the outermost concentric turn 106 by a contact structure 130. The contact structure 130 may be formed in the third connection level 170 (i.e., the connection level between the second connection level 166 and the fourth connection level 172). The outermost concentric turn 106 in the inner portion 109 may be formed in the same connection level as the innermost concentric turn 128 and the outermost concentric turn 102 in the outer portion 103, e.g., connection level 166.

As shown in FIG. 10 and FIG. 11B, the outermost concentric turn 106 in the inner portion 109 of the upper section 110 of the inductor structure 100 may be connected to the innermost concentric turn 116 in the uppermost spiral level 118*x* of the lower section 118 of the inductor structure 100, for example, by a contact structure 124 formed in the first connection level 164 in the redistribution layer 168.

As shown in FIG. 10 and FIG. 11C, the innermost concentric turn 128 in the outer portion 103 of the upper section 110 of the inductor structure 100 may be connected to the outermost concentric turn 112 in the uppermost spiral level 118*x* of the lower section 118 of the inductor structure 100 by a contact structure 136 formed in the first connection level 164 in the redistribution layer 168.

The exemplary configurations of the innermost concentric turn 107 and the outermost concentric turn 106 in the upper section 110 of the inductor structure 100, as described in FIG. 10, FIG. 11A to FIG. 11C, are contemplated as being applicable to all examples of the present disclosure.

Throughout this disclosure, it is to be understood that if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in an embodiment" herein do not necessarily all refer to the same embodiment.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. Furthermore, there is no intention to be bound by any theory presented in the preceding background or the following detailed description. Additionally, the various tasks and processes described herein may be incorporated into a more comprehensive procedure or process having additional functionality not described in detail herein.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

As will be readily apparent to those skilled in the art upon a complete reading of the present application, the disclosed semiconductor devices and methods of forming the same may be employed in manufacturing a variety of different integrated circuit products, including, but not limited to, radio frequency (RF) modules or applications. FinFET devices, planar transistor devices. CMOS devices, wide bandgap semiconductor devices, etc.

What is claimed is:

1. A semiconductor device comprising:

a semiconductor chip;

a redistribution layer on the semiconductor chip; and an inductor structure having a center region, an upper section in the redistribution layer, and a lower section in the semiconductor chip, the upper section and the lower section are concentric about the center region, the lower section is connected to the upper section, the upper section comprising an outer portion having a concentric turn about the center region and an inner portion having a concentric turn about the center region, the lower section comprising a concentric turn about the center region, wherein the concentric turn in the inner portion of the upper section of the inductor structure has a smaller perimeter than the concentric turn in the lower section of the inductor structure and the concentric turn in the inner portion of the upper section of the inductor structure does not overlap with the concentric turn in the lower section of the inductor structure.

2. The semiconductor device of claim 1, wherein the concentric turn in the lower section of the inductor structure has a smaller perimeter than the concentric turn in the outer portion of the upper section of the inductor structure and the concentric turn in the lower section of the inductor structure does not overlap with the concentric turn in the outer portion of the upper section of the inductor structure.

3. The semiconductor device of claim 1, further comprising a contact structure that connects the concentric turn in the lower section of the inductor structure to the concentric turn in the inner portion of the upper section of the inductor structure.

4. The semiconductor device of claim 1, wherein the inner portion of the upper section of the inductor structure has a plurality of concentric turns about the center region, the plurality of concentric turns includes an innermost concentric turn and an outermost concentric turn, the innermost concentric turn has a smaller perimeter than the outermost concentric turn.

5. The semiconductor device of claim 4, wherein the innermost concentric turn in the inner portion of the upper section of the inductor structure is above the outermost concentric turn in the inner portion of the upper section of the inductor structure.

6. The semiconductor device of claim 4, wherein the lower section of the inductor structure includes a plurality of concentric turns about the center region, the plurality of concentric turns includes an innermost concentric turn and an outermost concentric turn.

7. The semiconductor device of claim 6, wherein the innermost concentric turn in the lower section of the inductor structure has a larger perimeter than the outermost concentric turn in the inner portion of the upper section of the inductor structure.

8. The semiconductor device of claim 7, wherein the outermost concentric turn in the lower section of the inductor structure has a smaller perimeter than the concentric turn in the outer portion of the upper section of the inductor structure.

9. The semiconductor device of claim 8, wherein the innermost concentric turn in the lower section of the inductor structure is connected to the outermost concentric turn in the inner portion of the upper section of the inductor structure.

10. The semiconductor device of claim 9, wherein the outermost concentric turn in the lower section of the inductor structure is connected to the concentric turn in the outer portion of the upper section of the inductor structure.

11. A semiconductor device comprising:

a semiconductor chip;

a redistribution layer on the semiconductor chip; and an inductor structure having a center region, an upper section in the redistribution layer, and a lower section in the semiconductor chip, the upper section and the lower section are concentric about the center region, the upper section comprising an outer portion having at least one concentric turn about the center region and an inner portion having at least one concentric turn about the center region, the at least one concentric turn in the inner portion having an outermost concentric turn, the lower section comprising a plurality of spiral levels, each spiral level includes at least one concentric turn about the center region, the plurality of spiral levels has an uppermost spiral level being connected to the upper section of the inductor structure, the uppermost spiral level having an innermost concentric turn, wherein the outermost concentric turn in the inner portion of the upper section of the inductor structure has a smaller perimeter than the innermost concentric turn in the uppermost spiral level of the lower section of the inductor structure and the outermost concentric turn in the inner portion of the upper section of the inductor structure does not overlap with the innermost concentric turn in the uppermost spiral level of the lower section of the inductor structure.

12. The semiconductor device of claim 11, wherein the lower section of the inductor structure is between the outer portion in the upper section of the inductor structure and the inner portion in the upper section of the inductor structure.

13. The semiconductor device of claim 11, wherein the outermost concentric turn in the inner portion of the upper section of the inductor structure is connected to the innermost concentric turn in the uppermost spiral level of the lower section of the inductor structure.

14. The semiconductor device of claim 11, wherein the uppermost spiral level of the lower section of the inductor structure has an outermost concentric turn, the outermost concentric turn in the uppermost spiral level of the lower section of the inductor structure is connected to the outer portion of the upper section of the inductor structure.

15. The semiconductor device of claim 11, wherein the inner portion of the upper section of the inductor structure has an innermost concentric turn, and the redistribution layer includes a conductive layer being connected to the innermost concentric turn in the inner portion of the upper section of the inductor structure.

16. The semiconductor device of claim 15, wherein the conductive layer extends over and across the at least one concentric turn in the uppermost spiral level of the lower section of the inductor structure.

17. The semiconductor device of claim 11, wherein the inner portion of the upper section of the inductor structure has an innermost concentric turn, the innermost concentric turn in the inner portion of the upper section of the inductor structure has a smaller width than the outermost concentric turn in the inner portion of the upper section of the inductor structure.

18. The semiconductor device of claim 17, wherein the at least one concentric turn in the outer portion of the upper section of the inductor structure has a larger width than the outermost concentric turn in the inner portion of the upper section of the inductor structure.

19. The semiconductor device of claim 11, wherein the uppermost spiral level of the lower section of the inductor structure has an outermost concentric turn, the outermost concentric turn in the uppermost spiral level of the lower section of the inductor structure has a smaller perimeter than the at least one concentric turn in the outer portion of the upper section of the inductor structure, and wherein the outermost concentric turn in the uppermost spiral level of the lower section of the inductor structure does not overlap with the at least one concentric turn in the outer portion of the upper section of the inductor structure.

20. A semiconductor device comprising:

a semiconductor chip;

a redistribution layer on the semiconductor chip; and an inductor structure having a center region, an upper section in the redistribution layer, and a lower section in the semiconductor chip, the upper section and the lower section are concentric about the center region, the upper section comprising an outer portion having at least one concentric turn about the center region and an inner portion having at least one concentric turn about the center region, the at least one concentric turn in the inner portion having an outermost concentric turn, the lower section comprising a plurality of spiral levels, each spiral level includes at least one concentric turn about the center region, the plurality of spiral levels has an uppermost spiral level being connected to the upper section of the inductor structure, the uppermost spiral level has an innermost concentric turn, wherein the lower section of the inductor structure is between the outer portion of the upper section of the inductor structure and the inner portion of the upper section of the inductor structure, and the at least one concentric turn in the inner portion of the upper section of the inductor structure do not overlap with the plurality of spiral levels in the lower section of the inductor structure.

* * * * *